(12) United States Patent
Shin

(10) Patent No.: US 6,442,077 B2
(45) Date of Patent: Aug. 27, 2002

(54) CONTROLLING READING FROM AND WRITING TO A SEMICONDUCTOR MEMORY DEVICE

(75) Inventor: Dong Woo Shin, Kyoungki-do (KR)

(73) Assignee: Hyundai Electronics Industries, Co., Ltd. (KR)

( * ) Notice: Subject to any disclaimer, the term of this patent is extended or adjusted under 35 U.S.C. 154(b) by 30 days.

(21) Appl. No.: 09/751,394

(22) Filed: Jan. 2, 2001

(30) Foreign Application Priority Data

Dec. 30, 1999 (KR) ......................................... 1999-65711

(51) Int. Cl.$^7$ ................................................. G11C 7/00
(52) U.S. Cl. ........................... 365/189.07; 365/189.01; 365/227; 365/149
(58) Field of Search ....................... 365/189.07, 189.01, 365/227, 149

(56) References Cited

U.S. PATENT DOCUMENTS

| | | | | |
|---|---|---|---|---|
| 5,901,335 A | * | 5/1999 | Kim ............................ | 395/898 |
| 6,205,065 B1 | * | 3/2001 | Sugibayashi ................. | 365/200 |
| 6,327,199 B1 | * | 12/2001 | Fister .......................... | 365/201 |

* cited by examiner

*Primary Examiner*—Hoai V. Ho
*Assistant Examiner*—Connie G. Yoha
(74) *Attorney, Agent, or Firm*—Pillsbury Winthrop LLP

(57) ABSTRACT

The inventions herein feature an arrangement for controlling read and write operations in a semiconductor memory device, which can reduce power consumption by controlling data read and write operations in a DRAM having an open drain output buffer. The circuit for controlling the read and write operations in the semiconductor memory device includes a write unit for comparing potential states of bits of a write data according to a control signal, converting the write data into a first logic level and writing the converted data on DRAMs as an internal data with a flag bit having a first logic level, when a number of the bits having the first logic level is greater than a number of the bits having a second logic level, and writing the write data on the DRAMs as an internal data with a flag bit having the second logic level, when the number of the bits having the first logic level is equal to or smaller than the number of the bits having the second logic level. A read unit reads a read data read from the DRAMs, or converts the read data and reads the converted data according to the potential state of the flag bit.

19 Claims, 7 Drawing Sheets

CONTROLLING READING FROM AND WRITING TO A SEMICONDUCTOR MEMORY DEVICE

BACKGROUND

1. Field of the Invention

The present invention relates to controlling reading from and writing to a semiconductor memory device. The inventions claimed herein include, but are not limited to circuit arrangements and methods. More specifically, some of the inventions claimed herein feature an improved method and circuit for controlling read and write operations in a semiconductor memory device, which can reduce power consumption by controlling data read and write operations in a dynamic random access memory (DRAM) having an open drain output buffer structure.

2. General Background and Related Art

FIG. 1 (Prior Art) is block diagram of a Rambus DRAM system that helps to explain a conventional method for controlling reading from and writing to a semiconductor memory device. The Rambus DRAM system includes a controller 11, and a plurality of Rambus DRAMs 12~12n whose read and write operations are controlled by the controller 11. The controller 11 and Rambus DRAMs 12~12n transmit/receive a data DATA, an address ADD, a control signal CON and a parity bit Parity to/from each other through channels.

FIG. 2 (Prior Art) is a circuit diagram illustrating a conventional data input/output circuit for the semiconductor memory device having an open drain structure. As shown in the drawing, a conventional data input/output circuit for Rambus DRAM has an open drain structure, and consists of an input unit 22 and an output unit 24. Each of units 22 and 24 include one buffer 211 or 221 and one NMOS transistor 212 or 222.

The NMOS transistor 212 or 222 is turned on only when a logic "low" data value(0) is applied thereto. However, when the NMOS transistor 212 or 222 is turned on, a current path is formed to a ground voltage Vss, which results in large consumption of power. Moreover, the conventional data input/output circuit having the open drain structure writes data as it is, regardless of a structure of a data output buffer, thereby consuming much power.

SUMMARY

Some of the inventions claimed herein feature methods and others feature circuits for controlling reading from and writing to a semiconductor memory device. The arrangements claimed herein can reduce power consumption by controlling data read and write operations in a dynamic random access memory (DRAM) having an open drain output buffer structure.

One exemplary embodiment of the invention features a method for a single controller to control writing write data to a plurality of DRAMs, or using a single controller to read read data from the plurality of DRAMs.

Also featured is a method for controlling read and write operations in a semiconductor memory device including:

detecting potential levels of bits of the write data, converting the write data, writing the converted data to a plurality of DRAMs as internal data with a flag bit having a first logic level, when a number of the bits having the first logic level is greater than a number of the bits having a second logic level, and writing the write data as it is to the plurality of DRAMs as an internal data with a flag bit having the second logic level, when the number of the bits having the first logic level is equal to or smaller than the number of the bits having the second logic level; and distinguishing a logic level of the flag bit written on the plurality of DRAMs, converting an internal data from the plurality of DRAMs and reading the converted data as the read data, when the flag bit has the first logic level, and reading the internal data from the plurality of DRAMs as the read data when the flag bit has the second logic level.

In the exemplary embodiments, the first logic level is "low" and the second logic level is "high". However, different logic levels could be utilized without departing from the spirit of the invention. Also, in the exemplary embodiments the write data is 8 bit data. Of course, other types of data structures could be used.

Some of the claimed inventions feature a circuit for controlling reading from and writing to a semiconductor memory device.

The circuit includes a write unit for comparing potential states of bits of a write data according to a control signal, converting the write data into a first logic level and writing the converted data on DRAMs with a flag bit having a first logic level, when a number of the bits having the first logic level is greater than a number of the bits having a second logic level, and writing the write data on the DRAMs as an internal data with a flag bit having the second logic level, when the number of the bits having the first logic level is equal to or smaller than the number of the bits having the second logic level. A read unit reads a read data read from the DRAMs, or converts the read data and reads the converted data according to the potential state of the flag bit. In the exemplary embodiments, the first logic level is "low" and the second logic level is "high". However, different logic levels could be utilized without departing from the spirit of the invention.

In accordance with some of the claimed inventions, the write unit includes an input conversion unit for comparing the potential states of the bits of the write data according to the control signal, setting the flag bit to a "low" level and converting the write data when a number of the logic "low" bits is greater than a number of the logic "high" bits, and setting the flag bit to a "high" level and outputting the write data when the number of the logic "low" bits is equal to or smaller than the number of the logic "high" bits; and an input buffer unit for transmitting the data and the flag bit from the input conversion unit to the DRAMs.

In accordance with some of the claimed inventions, the input conversion unit includes: a data comparison unit for comparing the potential states of the bits of the write data according to the control signal. A signal sense unit generates different flag bit signals according to the potential state of the output signal from the data comparison unit. A data conversion unit receives and inverts the write data. A data selector unit selectively outputs the data converted through the data conversion unit or the write data according to the flag signal from the signal sense unit.

In accordance with some of the claimed inventions, the data comparison unit includes first and second source voltage supplying units for respectively supplying a first source voltage and a second source voltage according to the control signal. A plurality of inverters connected in parallel between the first and second source voltage supplying units, respectively receive signals of the bits of the write data, and output output signals to one output terminal. A data conversion preventing unit connected between the output terminal and the second source voltage supplying unit, prevents data conversion of the output terminal when the respective bits of the write data have an identical potential level.

In the exemplary embodiments, the first source voltage is a supply voltage and the second source voltage is a ground voltage. Of course, other voltage levels could be used without departing from the spirit of the invention.

In the exemplary embodiments, the first source voltage supplying unit includes a PMOS transistor and the second source voltage supplying unit includes an NMOS transistor. However, alternative configurations are possible.

In the exemplary embodiments, the plurality of inverters respectively include PMOS and NMOS transistors. However, alternative configurations are possible.

In the exemplary embodiments, the data conversion-preventing unit includes an NMOS transistor having its gate connected to receive the supply voltage. However, alternative configurations are possible.

In the exemplary embodiments, the signal sense unit includes a sense amplifier for setting the flag bit to a "high" level when the output signal from the data comparison unit is at a "low" level, and setting the flag bit to a "low" level when it is at a "high" level. However, alternative configurations are possible.

In the exemplary embodiments the data conversion unit includes inverters as many as the number of the bits of the write data. However, alternative configurations are possible. Also, in the exemplary embodiments, the data selector unit includes a multiplexer. However, alternative configurations are possible.

In exemplary embodiments, the read unit includes an output receiver unit for transmitting the internal data and the flag bit from the DRAMs. An output conversion unit outputs the data from the output receiver unit as the read data, or converts the data and outputs the converted data as the read data, according to the flag bit from the output receiver unit.

In exemplary embodiments, the output conversion unit includes a data conversion unit for converting the internal data transmitted from the DRAMs through the output receiver unit. A data selector unit selectively outputs the internal data from the DRAMs as the read data, or converts the data and outputs the converted data as the read data, according to the flag bit transmitted from the DRAMs through the output receiver unit.

In exemplary embodiments, the data conversion unit includes inverters as many as the number of the bits of the write data, the inverters being connected in parallel. However, other configurations are possible. In exemplary embodiments, the data selector unit includes a multiplexer. However, other configurations are possible.

BRIEF DESCRIPTION OF THE DRAWINGS

Exemplary embodiments of the claimed inventions will be described with reference to the accompanying drawings which are given only by way of illustration and thus are not limitative of the present invention, wherein:

DETAILED DESCRIPTION

Figure 1:
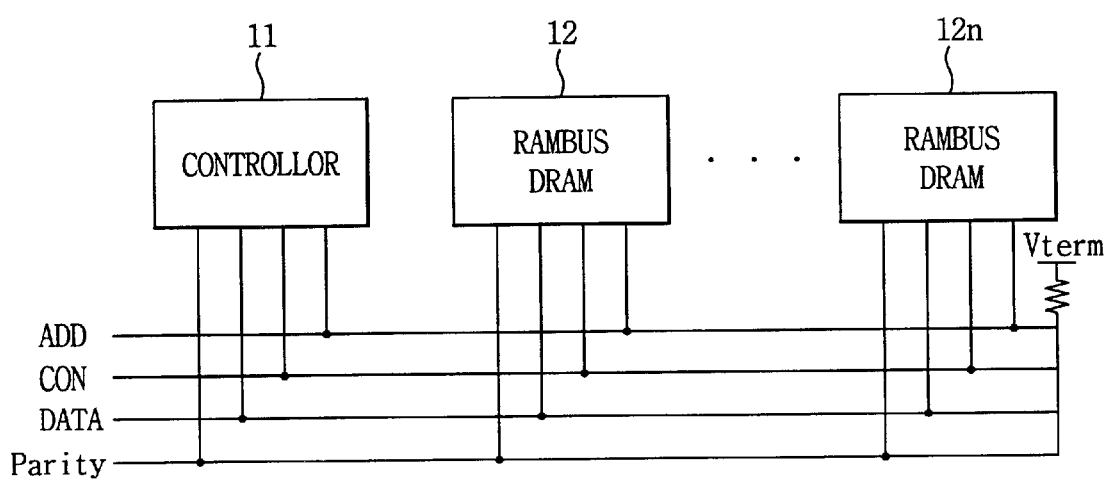
FIG. 1 (Prior Art) is a block diagram of a conventional Rambus DRAM system.
Figure 2:
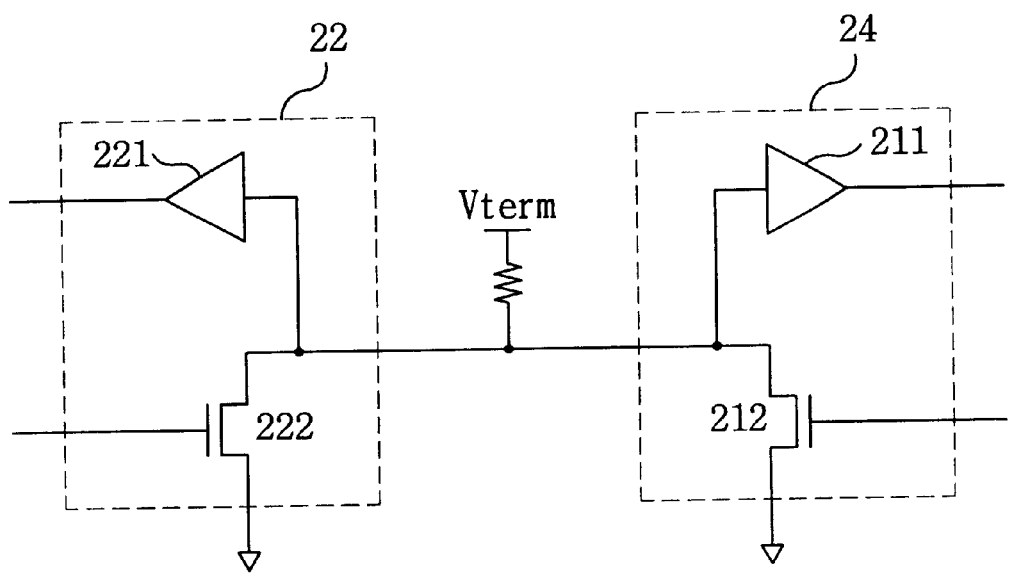
FIG. 2 (Prior Art) is a circuit diagram of a conventional data input/output circuit for a semiconductor memory device having an open drain structure.

An exemplary method and circuit for controlling read and write operations of a semiconductor memory device in accordance with the principles of the claimed inventions will now be described in detail with reference to the accompanying drawings. Elements having an identical function are provided with the identical reference numeral, and repeated explanations thereof will be omitted.

Figure 3:
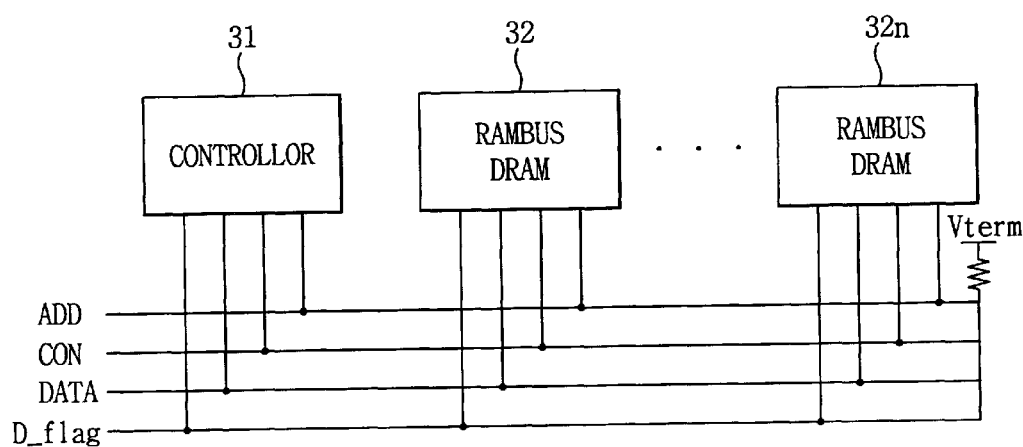
FIG. 3 is a block diagram of a Rambus DRAM system according to an illustrative embodiment of the present invention.

FIG. 3 is a block diagram illustrating a Rambus DRAM system in accordance with the preferred embodiment of the present invention. The semiconductor memory device, configured in accordance with the principles of the claimed inventions includes a controller 31 for receiving an address ADD, a control signal CON, a data signal DATA and a flag bit D_flag through respective channels; and a plurality of Rambus DRAMS 32~32n.

The semiconductor memory device uses the flag bit D_flag for data conversion, instead of a parity bit as in conventional arrangements. According to the flag bit D_flag, the controller 31 directly inputs the respective data to the plurality of Rambus DRAMs 32~32n, or inputs the data after inversion.

When more than a half of bits of an input data to be written from a processor (not shown) to the Rambus DRAMs 32~32n have a logic "low" value(0), the memory controller 31 sets the flag bit D_flag to a logic "low" level(0), inverts the input data, and writes the inverted data on the Rambus DRAMs 32~32n. Conversely, when less than a half of the bits of the input data have a logic "low" value(0), the memory controller 31 sets the flag bit D_flag to a logic "high" level(1), and writes the input data on the Rambus DRAMs 32~32n.

During a read operation, when the flag bit D_flag is set to have a logic "low" value (0), the controller 31 inverts a data read from the Rambus DRAMs 32~32n, and outputs the inverted data. When the flag bit D_flag is set to have a logic "high" value (1), the controller 31 outputs the data read from the Rambus DRAMs 32~32n.

Accordingly, when at least a half of the bits of the input data have a logic "low" value(0), the logic "low" value is outputted by using the flag bit D_flag distinguishing data inversion, thereby reducing power consumption by minimizing the ON states of NMOS transistor of an output terminal having an open drain structure.

Figure 4:
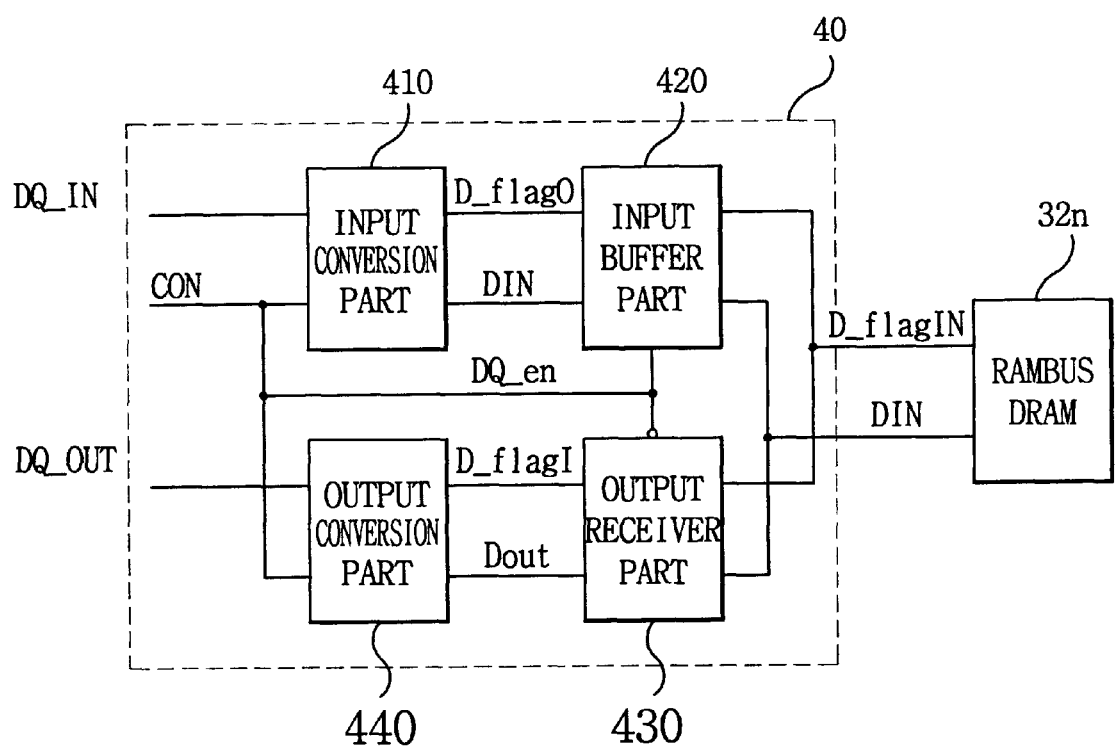
FIG. 4 is a circuit for controlling read and write operations of a semiconductor memory device according to an illustrative embodiment of the present invention.

FIG. 4 is a block diagram of a circuit for controlling the read and write operations of a semiconductor memory device in accordance with an exemplary embodiment of the claimed inventions. The circuit for controlling the read and write operations is disposed at the controller 31 as shown in FIG. 3, for controlling data input/output of the Rambus DRAMs 32~32n.

The circuit includes: an input conversion part 410 for detecting states of bits of a write data DQ_IN inputted through a DQ pin according to a control signal CON, converting the flag bit D_flag0 into a logic "low" level(0) and converting the write data DQ_IN, when a number of the bits having the logic "low" level(0) is greater than a number of the bits having a logic "high" level(1), and converting the flag bit D_flag0 into a "high" level and outputting the write data DQ_IN as it is, when the number of the bits having the logic "low" level(0) is equal to or smaller than the number of the bits having the logic "high" level(1); an input buffer part 420 for buffering the data signal DIN and the flag bit D_flag0 outputted from the input conversion part 410, and outputting them to the plurality of Rambus DRAMs 32~32n; an output receiver part 430 for buffering and outputting the internal read data DIN and flag bit D_flagIN from the plurality of Rambus DRAMs 32~32n; and an output conversion part 440 for outputting a read data Dout transmitted through the output receiver part 430 to the DQ pin, or outputting the read data Dout after conversion, according to a flag bit D_flagI from the output receiver part 430. Here, the input buffer part 420 and the output receiver part 430 are enabled according to a data enable signal DQ_en among the control signals CON applied from the processor.

According to the preferred embodiment of the present invention, a data DQ_OUT inputted from the input conversion part 410 through the DQ pin is a write data to be stored in the Rambus DRAMs 32~32n, and a data DQ_OUT read from the Rambus DRAMs 32~32m and outputted to the DQ pin through the output receiver part 430 and the output inversion part 440 is a read data.

Also, a data inputted to the plurality of Rambus DRAMs 32~32n through the input conversion unit 410 and the input buffer part 420 is an internal write data DIN, and a data read from the plurality of Rambus DRAMs 32~32n and inputted to the output receiver part 430 is an internal read data DIN.

Figure 5:
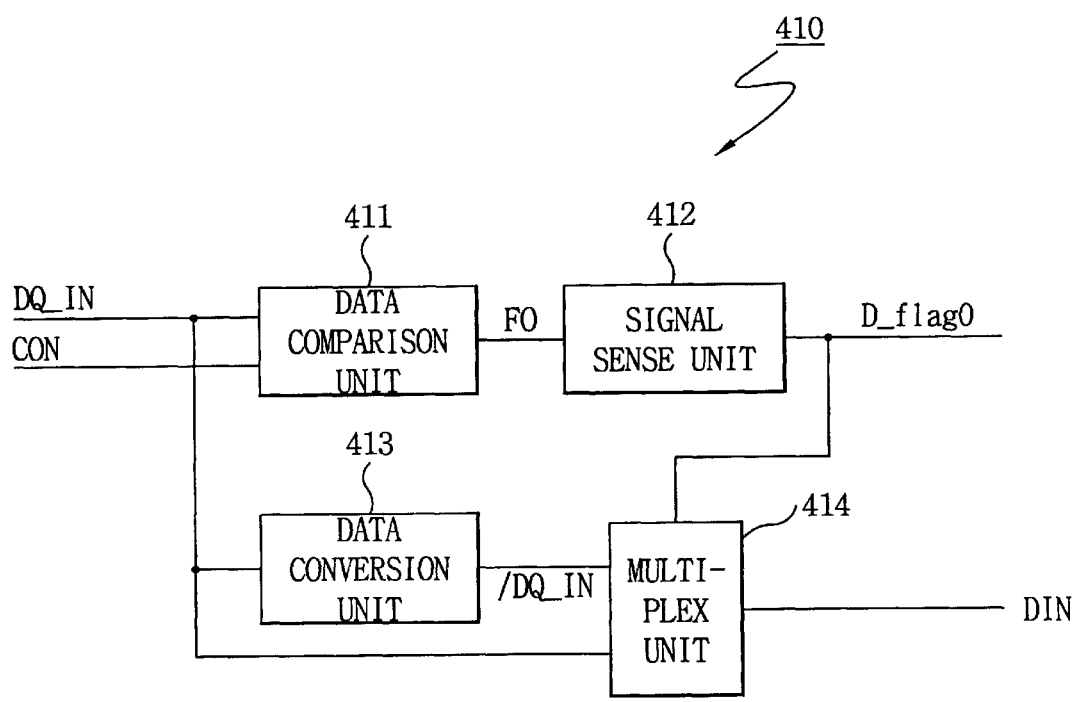
FIG. 5 is a block diagram of an input conversion unit such as shown in FIG. 4.

FIG. 5 is a block diagram illustrating a structure of the input conversion part 410 in FIG. 4. The input conversion part 410 includes a data comparison unit 411 enabled according to the control signal CON, for comparing the write data DQ_IN. A signal sense unit 412 senses the output signal from the data comparison unit 410, and generates the flag signal D_flag0. A data conversion unit 413 receives and converts the write data DQ_IN. A multiplex unit 414 selectively outputs the data converted through the data conversion unit 413 or the write data DQ_IN according to the flag signal D_flag0 from the signal sense unit 412.

Figure 6:
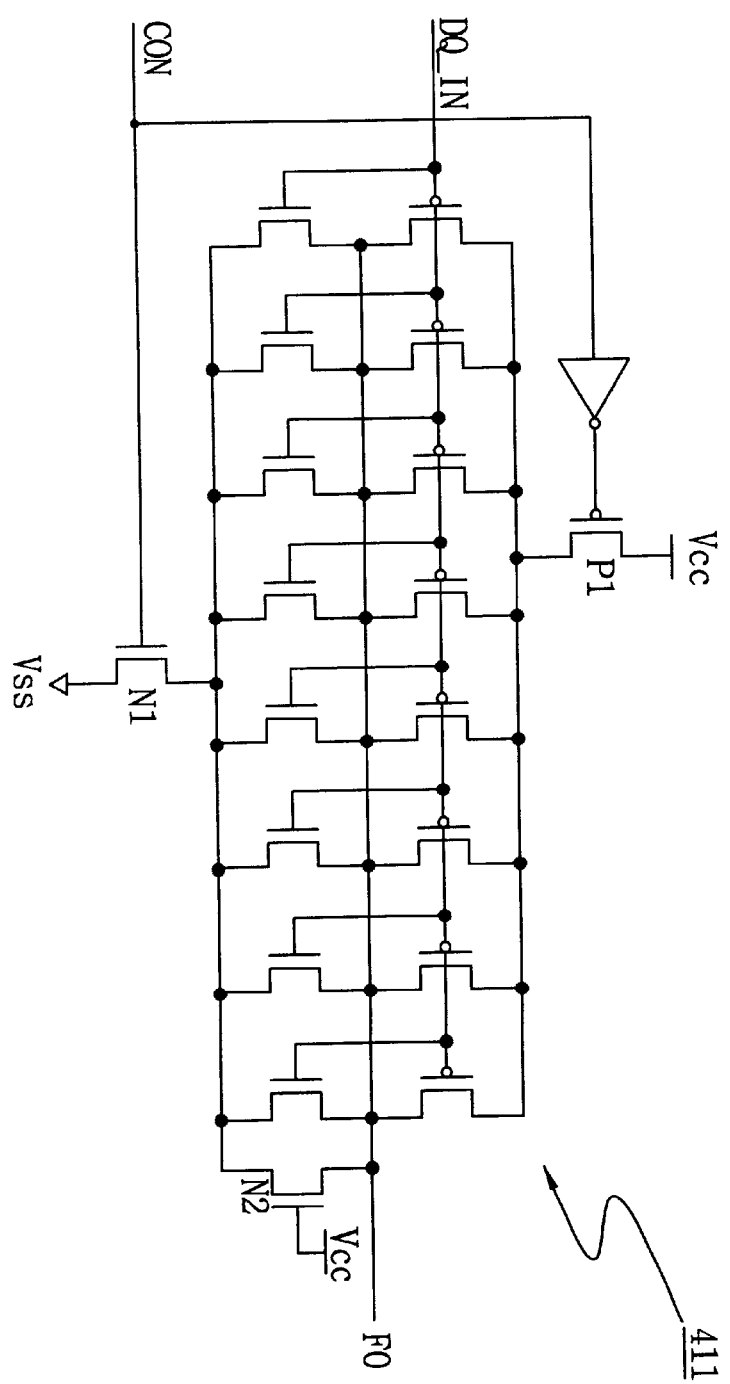
FIG. 6 is a block diagram of a data comparison unit such as shown in FIG. 5.

As illustrated in FIG. 6, the data comparison unit 411 includes a PMOS transistor P1 for supplying a source voltage Vcc according to an inverted signal of the control signal CON. An NMOS transistor N1 supplies a ground voltage Vss according to the control signal CON. A plurality of inverters connected in parallel between the PMOS transistor P1 and the NMOS transistor N1, respectively receive bit signals of the write data DQ_IN, and output them to an output terminal F0. An NMOS transistor N2 having its gate connected to receive the source voltage Vcc, is connected between the output terminal F0 and the NMOS transistor N1, in order to prevent data inversion of the output terminal F0 when the bits of the write data DQ_IN have an identical potential level.

The data comparison unit 411 compares the write data DQ_IN, outputs a "high" level output signal F0 when the number of the logic "low" bits is greater than the number of the logic "high" bits, and outputs a "low" level signal when the number of the logic "low" bits is equal to or smaller than the number of the logic "high" bits. The plurality of inverters are connected in parallel one another, each inverter having the same current transmission ability.

The signal sense unit 412 includes a sense amplifier for sensing the output signal F0 from the data comparison unit 411, setting the flag bit D_flag0 to a logic "high" level when the output signal F0 is at a "low" level, and setting the flag bit D_flag0 to a logic "low" level when the output signal F0 is at a "high" level.

Figure 7:
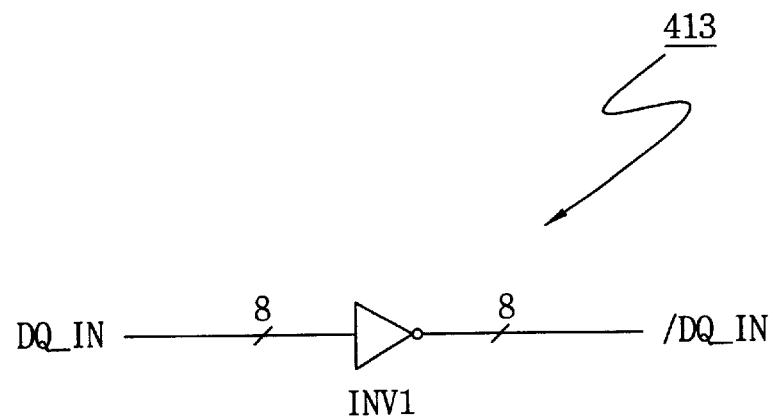
FIG. 7 is a block diagram of a data conversion unit such as shown in FIG. 5.

As depicted in FIG. 7, the data conversion unit 413 includes inverters as many as the number of the bits of the write data DQ_IN, and inverts and outputs the inputted write data DQ_IN. The data multiplex unit 414 includes a multiplexer for selectively outputting the inputted write data DQ_IN, or the data/DQ_IN inverted in the data conversion unit 413, according to the flag bit D_flag0 applied from the signal sense unit 412.

Figure 8:
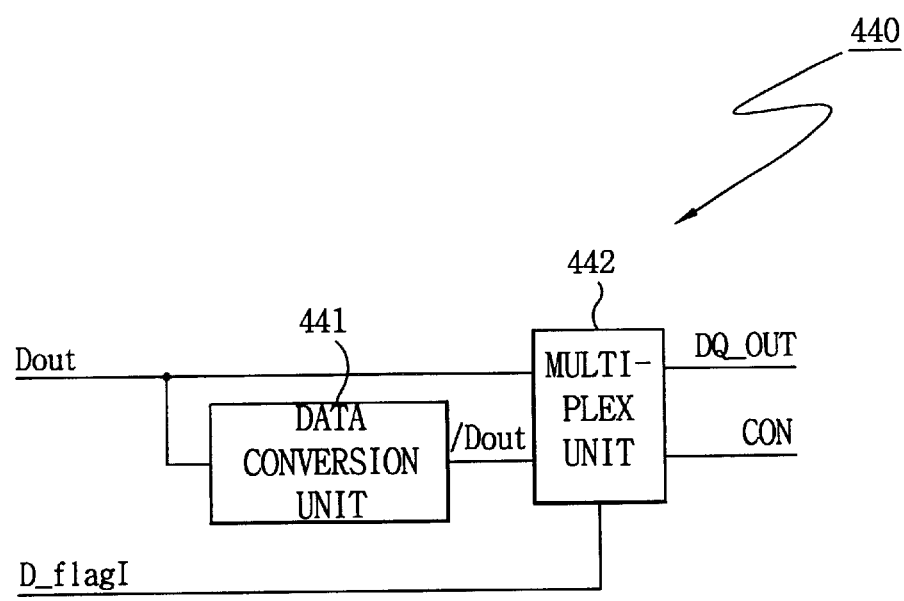
FIG. 8 is a block diagram of an output conversion unit such as shown in FIG. 4.

FIG. 8 is a block diagram illustrating a structure of the output conversion unit 440 in FIG. 4. The output conversion part 440 includes a data conversion unit 441 for inverting the internal data Dout transmitted through the DRAMs and the output receiver part 430. A data selector unit selectively outputs the internal data Dout from the output receiver part 430 as the read data DQ_OUT, or the internal data/Dout inverted by the data conversion unit 441 as the read data DQ_OUT, according to the flag bit D_flagI transmitted through the DRAMs and the output receiver part 430.

The data conversion unit 441 has an identical structure to the data conversion unit 413 as shown in FIG. 7, and includes eight (8) inverters connected in parallel and having their input terminals connected to receive the internal data Dout by one bit. The output conversion part 440 also includes a multiplex unit 442 for receiving the internal data Dout from the output receiver part 430, or the data/Dout inverted by the data conversion unit 441, and multiplexing them according to the flag bit D_flagI applied from the output receiver part 430.

The operation of the circuit for controlling the read and write operations in the semiconductor memory device in accordance with the present invention will now be described. Firstly, the operation of writing the write data DQ_IN from the processor on the DRAMs 32~32n by the circuit for controlling the read and write operations in the controller 31 will be explained.

When the external write data DQ_IN and the control signal CON are applied to the input conversion unit 410, the data comparison unit 411 of the input conversion unit 410 is enabled according to the control signal CON. Here, the data comparison unit 411 compares the data DQ_IN applied to the input terminals of the inverters by one bit.

As a result of the comparison, when the number of the logic "low" bits(0) of the 8 bit data DQ_IN is greater than the number of the logic "high" bits(1) thereof, the data comparison unit 411 generates the "high" level output signal F0. Conversely, when the number of the logic "low" bits(0) is equal to or smaller than the number of the logic "high" bits(1), the data comparison unit 411 generates the "low" level output signal F0.

The signal sense unit 412 senses the output signal F0 from the data comparison unit 411, and sets the flag bit D_flag0 for data input. When the number of the logic "low" bits is greater than the number of the logic "high" bits and the output signal F0 is at a "high" level, the signal sense unit 412 sets the flag bit D_flag0 to a "low" level. When the number of the logic "low" bits is equal to or smaller than the number of the logic "high" bits and the output signal F0 is at a "low" level, the signal sense unit 412 sets the flag bit D_flag0 to a "high" level.

The data conversion unit 413 of the input conversion part 410 converts the write data DQ_IN from the processor. The multiplex unit 414 which is the data selector unit selects one of the internal data/DQ_IN converted through the data conversion unit 413 and the write data DQ_IN, and transmits the selected data to the input buffer part 420 with the flag bit D_flag0, according to the flag bit D_flag0 generated from the signal sense unit 412. The input buffer part 420 writes the flag bit D_flagIN for data write and the internal data DIN from the input conversion unit 410 on the plurality of DRAMs 32~32n.

The multiplex unit 414 transmits the inverted data/DQ_IN as the internal data DIN when the flag bit D_flag0 has a value of '0', and transmits the external data DQ_IN as the internal data DIN when the flag bit D_flag0 has a value of '1'. Therefore, in the data written on the DRAMs 32~32n, the number of the logic "low" bits(0) is always smaller than the number of the logic "high" bits(1). At this time, the control signal CON inputted to the input conversion part 410 is one of the control signals applied from the processor, and is enabled only for the data preparation in a write mode.

As illustrated in FIG. 6, when the control signal has a logic "high" value (1), the data comparison unit 411 of the input conversion part 410 forms a current path by supplying the source voltage Vcc to the plurality of inverters sharing a plurality of output terminals through the PMOS transistor P1, and supplying the ground voltage thereto through the NMOS transistor N1. In addition, the plurality of inverters consisting of the PMOS and NMOS transistors are operated according to potential levels of the bits of the data signal DQ_IN applied to their gates. Here, the data comparison unit 411 outputs a "high" level signal F0 when the number of the logic "low" bits of the data DQ_IN is greater than the number of the logic "high" bits thereof, and outputs a "low" level signal F0 when the number of the logic "low" bits is equal to or smaller than the number of the logic "high" bits.

Thereafter, the operation of reading the internal data DIN written on the plurality of DRAMs 32~32n with the flag bit D_flagIN will now be explained. The data stored in the plurality of DRAMs 32~32n is read with the flag bit D_flagIN as the internal data DIN, and transmitted to the output receiver part 430. The output conversion part 440 inverts the internal data Dout from the output receiver part 430 by the data conversion unit 441 as shown in FIG. 8, and the multiplex unit 442 which is the data selector selectively outputs the data/Dout inverted through the data conversion unit 441, or the internal data Dout outputted from the output receiver part 430 as a read data DQ_out, according to the flag bit D_flagI for data read.

Here, the multiplex unit 442 transmits the inverted data/Dout as the read data DQ_OUT when the flag bit D_flagI has a value of '0', and transmits the internal data Dout as the read data DQ_OUT when the flag bit D_flagI has a value of '1'.

Accordingly, when the number of the logic "low" bits of the write data DQ_IN is greater than the number of the logic "high" bits thereof, the circuit for controlling the read and write operations stores the internal data/DQ_IN obtained by inverting the write data DQ_IN with the flag bit D_flag0 in the write operation, and inverts and outputs the data read from the DRAMs according to the state of the stored flag bit D_flag0 in the read operation, thereby restoring the original state of the data. As a result, the number of the logic "low" bits of the data is maintained smaller than the number of the logic "high" bits thereof, which results in reduced power consumption in the memory device having the open drain structure input/output terminal.

As discussed earlier, when the number of the logic "low" bits is greater than the number of the logic "high" bits, the circuit and method for controlling the read and write operation in the semiconductor memory device invert the data and write the inverted data on the DRAMs with the flag bit in the data write operation, and read the data or the inverted data thereof according to the state of the flag bit in the data read operation. Accordingly, it has the advantages of reducing the power consumption.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a method for controlling the writing of write data to a plurality of DRAMs by one controller, or an operation of reading a read data from the plurality of DRAMs, a method for controlling read and write operations of a semiconductor memory device, comprising:

detecting potential levels of bits of the write data, converting the write data and writing the converted data on the plurality of DRAMs as an internal data with a flag bit having a first logic level, when a number of the bits having the first logic level is greater than a number of the bits having a second logic level, and writing the write data as it is on the plurality of DRAMs as an internal data with a flag bit having the second logic level, when the number of the bits having the first logic level is equal to or smaller than the number of the bits having the second logic level; and distinguishing a logic level of the flag bit written on the plurality of DRAMs, converting an internal data from the plurality of DRAMs and reading the converted data as the read data, when the flag bit has the first logic level, and reading the internal data from the plurality of DRAMs as the read data when the flag bit has the second logic level.

2. A method according to claim 1, wherein the first logic level is a logic "low" level and the second logic level is a logic "high" level.

3. A method according to claim 2, wherein the write data is an 8 bit data.

4. A circuit for controlling read and write operations in a semiconductor memory device, comprising:

a write unit for comparing potential states of bits of a write data according to a control signal, converting the write data into a first logic level and writing the converted data on DRAMs with a flag bit having a first logic level, when a number of the bits having the first logic level is greater than a number of the bits having a second logic level, and writing the write data on the DRAMs as an internal data with a flag bit having the second logic level, when the number of the bits having the first logic level is equal to or smaller than the number of the bits having the second logic level; and a read unit for reading a read data read from the DRAMs, or converting the read data and reading the converted data according to the potential state of the flag bit.

5. A circuit according to claim 4, wherein the first logic level is a logic "low" level and the second logic level is a logic "high" level.

6. A circuit according to claim 4, wherein the write unit comprises:

an input conversion unit for comparing the potential states of the bits of the write data according to the control signal, setting the flag bit to a logic "low" level and converting the write data when a number of the logic "low" bits is greater than a number of the logic "high" bits, and setting the flag bit to a "high" level and outputting the write data when the number of the logic "low" bits is equal to or smaller than the number of the logic "high" bits; and an input buffer unit for transmitting the data and the flag bit from the input conversion unit to the DRAMs.

7. A circuit according to claim 6, wherein the input conversion unit comprises:

a data comparison unit for comparing the potential states of the bits of the write data according to the control signal;

a signal sense unit for generating different flag bit signals according to the potential state of the output signal from the data comparison unit;

a data conversion unit for receiving and inverting the write data; and a data selector unit for selectively outputting the data converted through the data conversion unit or the write data, according to the flag signal from the signal sense unit.

8. A circuit according to claim 7, wherein the data comparison unit comprises:

first and second source voltage supplying units for respectively supplying a first source voltage and a second source voltage according to the control signal;

a plurality of inverters connected in parallel between the first and second source voltage supplying units, for respectively receiving signals of the bits of the write data, and outputting output signals to one output terminal; and a data conversion preventing unit connected between the output terminal and the second source voltage supplying unit, for preventing data conversion of the output terminal when the respective bits of the write data have an identical potential level.

9. A circuit according to claim 8, wherein the first source voltage is a supply voltage and the second source voltage is a ground voltage.

10. A circuit according to claim 8, wherein the first source voltage supplying unit comprises a PMOS transistor and the second source voltage supplying unit comprises an NMOS transistor.

11. A circuit according to claim 8, wherein the plurality of inverters comprises PMOS and NMOS transistors, respectively.

12. A circuit according to claim 8, wherein the data conversion-preventing unit comprises an NMOS transistor having its gate connected to receive the supply voltage.

13. A circuit according to claim 7, wherein the signal sense unit comprises a sense amplifier for setting the flag bit to a "high" level when the output signal from the data comparison unit is "low", and setting the flag bit to "low" when it is at a "high" level.

14. A circuit according to claim 7, wherein the data conversion unit comprises inverters as many as the number of the bits of the write data.

15. A circuit according to claim 7, wherein the data selector unit comprises a multiplexer.

16. A circuit according to claim 4, wherein the read unit comprises:

an output receiver unit for transmitting the internal data and the flag bit from the DRAMs; and an output conversion unit for outputting the data from the output receiver unit as the read data, or converting the data and outputting the converted data as the read data, according to the flag bit from the output receiver unit.

17. A circuit according to claim 16, wherein the output conversion unit comprises:

a data conversion unit for converting the internal data transmitted from the DRAMs through the output receiver unit; and a data selector unit for selectively outputting the internal data from the DRAMs as the read data, or converting the data and outputting the converted data as the read data, according to the flag bit transmitted from the DRAMs through the output receiver unit.

18. A circuit according to claim 17, wherein the data conversion unit comprises inverters as many as the number of the bits of the write data, the inverters being connected in parallel.

19. A circuit according to claim 15, wherein the data selector unit comprises a multiplexer.

* * * * *